US008895354B2

(12) United States Patent  
Kugler et al.

(10) Patent No.: US 8,895,354 B2  
(45) Date of Patent: Nov. 25, 2014

(54) METHOD OF FORMING ORGANIC SEMICONDUCTOR DEVICE THAT INCLUDES FORMING ELECTRODE CONTACT LAYER BY TREATING ELECTRODE SURFACES WITH SUBSTANCE CONTAINING SUBSTITUTED ARENE

(75) Inventors: Thomas Kugler, Cambridge (GB); Christopher Newsome, Cambridgeshire (GB); Mohd K. Othman, Selangor (MY)

(73) Assignee: Cambridge Display Technology Limited, Cambridgeshire (GB)

( * ) Notice: Subject to any disclaimer, the term of this patent is extended or adjusted under 35 U.S.C. 154(b) by 0 days.

(21) Appl. No.: 13/807,190

(22) PCT Filed: Jun. 30, 2011

(86) PCT No.: PCT/GB2011/000984

§ 371 (c)(1),  
(2), (4) Date: Mar. 11, 2013

(87) PCT Pub. No.: WO2012/001358  
PCT Pub. Date: Jan. 5, 2012

(65) Prior Publication Data  
US 2013/0168662 A1  Jul. 4, 2013

(30) Foreign Application Priority Data  
Jul. 2, 2010 (GB) .................................. 1011155.7

(51) Int. Cl.  
*H01L 51/40* (2006.01)  
*H01L 51/05* (2006.01)  
*H01L 51/10* (2006.01)  
*H01L 51/00* (2006.01)

(52) U.S. Cl.  
CPC .......... *H01L 51/0541* (2013.01); *H01L 51/105* (2013.01); *H01L 51/05* (2013.01); *H01L 51/0026* (2013.01); *H01L 51/0055* (2013.01)  
USPC ......................................................... 438/99

(58) Field of Classification Search  
CPC ........................... H01L 51/0028; H01L 51/05  
See application file for complete search history.

(56) References Cited

U.S. PATENT DOCUMENTS

| 6,335,539 B1 | 1/2002 | Dimitrakopoulos et al. |
| 2004/0161873 A1 | 8/2004 | Dimitrakopoulos et al. |

(Continued)

FOREIGN PATENT DOCUMENTS

| GB | 2 458 483 A | 9/2009 |
| GB | 2 469 507 A | 10/2010 |

(Continued)

OTHER PUBLICATIONS

Park et al., "F-TES ADT Organic Integrated Circuits on Glass and Plastic Substrates," *International Electron Devices Meeting*, pp. 225-228 (2007).

(Continued)

*Primary Examiner* — Stephen W Smoot  
(74) *Attorney, Agent, or Firm* — Marshal, Gerstein & Borun LLP (57) ABSTRACT

Method for producing a semiconductor device such as an organic thin film transistor, and a device produced by the method, the method including the steps of forming conducting electrodes over a substrate, treating a surface of the electrodes with an arene substituted with an electron-withdrawing group to form an electrode contact layer over the electrodes, and forming an organic semiconductor layer over the substrate and electrodes, in which the substrate and electrodes are baked before the organic semiconductor layer is formed so as to reduce contaminants on the electrode contact layer and thereby promote improved crystal nucleation on a surface of the electrode.

19 Claims, 7 Drawing Sheets

(56) References Cited

U.S. PATENT DOCUMENTS

2006/0289858 A1     12/2006   Park et al.
2007/0194386 A1     8/2007   Hahn et al.

FOREIGN PATENT DOCUMENTS

JP            2009302169 A     12/2009
WO    WO-2010/015833 A1     2/2010
WO    WO-2010/068619 A1     6/2010

OTHER PUBLICATIONS

Park et al., "High-Mobility Spin-Cast Organic Thin Film Transistors," *Appl. Phys. Lett.*, 93:043301-1-043301-3 (2008).

Park et al., "Polymeric Substrate Spin-Cast diF-TESADT OTFT circuits," *Electron Device Letters*, 29(9):1004-1006 (2008).

Piliego et al., "High Electron Mobility and Ambient Stability in Solution-Processed Perylene-Based Organic Field-Effect Transistors," *Adv. Mater.*, 21(16):1573-1576 (2009).

Shankar et al., "Morphology and Electrical Transport in Pentacene Films on Silylated Oxide Surfaces," *J. Mat. Res.*, 19(7):2003-2007 (2004).

Examination Report for Application No. GB1011155.7, dated May 23, 2011.

International Preliminary Report on Patentability for Application No. PCT/GB2011/000984, dated Jan. 8, 2013.

International Search Report and Written Opinion for Application No. PCT/GB2011/000984, dated Nov. 29, 2011.

Search Report for Application No. GB1011155.7, dated May 20, 2011.

GB Search Report for Application No. GB1011155.7, dated Nov. 10, 2010.

METHOD OF FORMING ORGANIC SEMICONDUCTOR DEVICE THAT INCLUDES FORMING ELECTRODE CONTACT LAYER BY TREATING ELECTRODE SURFACES WITH SUBSTANCE CONTAINING SUBSTITUTED ARENE

FIELD OF THE INVENTION

The present invention relates to a method of forming a semiconductor device on a substrate such as glass, and to semiconductor devices such as thin-film transistors.

BACKGROUND

A thin-film transistor (TFT) is a device formed by depositing an active layer of semiconductor over a separate substrate such as glass or plastic, as opposed to more traditional transistors in which the semiconductor itself forms the substrate of the device. Furthermore, modern TFTs can be formed using organic semiconductors (OSCs) rather than the more traditional semiconductor materials such as silicon or metal oxides. These are referred to as organic thin-film transistors (OTFTs), and have found particular success in applications such as display screens for computers, televisions, mobile terminals and other appliances.

Figure 1:
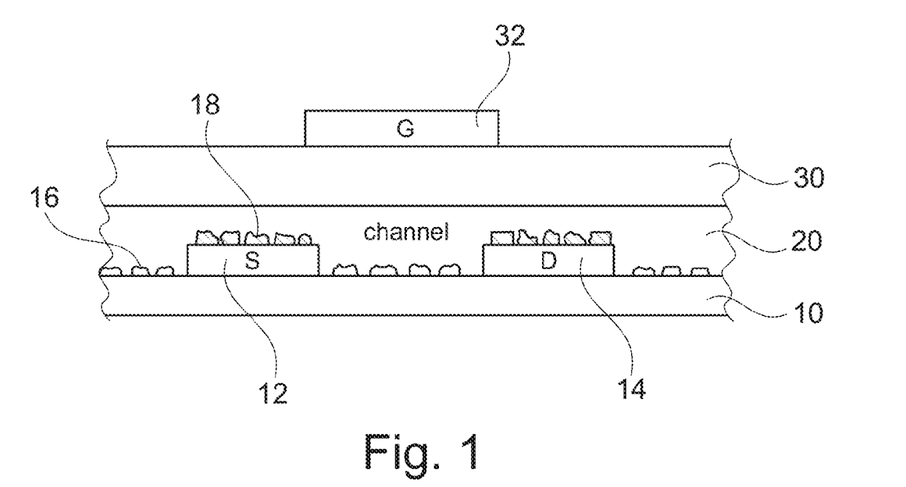
FIG. 1 is a schematic side cross-section through the layers of a top-gate OTFT.

An example of an OTFT device is illustrated schematically in FIG. 1. A typical process of producing this device begins by defining source and drain electrodes 12 and 14 over the glass substrate 10 by means of a technique such as photolithography or shadow mask evaporation. Each of the source and drain electrodes 12, 14 comprises a suitable conductor such as gold. An organic semiconductor layer 20 is then formed over the substrate 10 and source and drain electrodes 12, 14, e.g. by spin coating. This is followed by a dielectric layer 30 formed over the semiconductor layer 20, and a gate electrode 32 formed over the dielectric layer 30. This arrangement may be referred to as a top-gate transistor.

In operation, charge carriers flow through a channel region between the source and drain electrodes 12, 14 in dependence on a signal applied at the gate 32. Charge carriers can either be negatively charged electrons ($e^-$) in the case of an n-type semiconductor or positively-charged holes ($h^+$) in the case of a p-type semiconductor.

An n-type organic semiconductor material comprises a small number of molecules in which an electron occupies the Lowest Unoccupied Molecular Orbital (LUMO). These electrons are able to move in-between LUMO orbitals of neighboring molecules, and hence act as negative charge carriers. A p-type semiconductor material comprises a small number of "holes", each corresponding to a semiconductor molecule where one of the two electrons occupying the Highest Occupied Molecular Orbital (HOMO) is missing. These holes are able to accept electrons from adjacent molecules, and hence the holes can move like positively charged carriers.

One aspect of the performance of the device is its charge carrier mobility (the charge carrier drift velocity per unit electric field). Without thereby being limited by theory, in order to achieve a high mobility and therefore good performance, there are at least two properties of the device which it is desirable to control during production.

Firstly, a good ohmic contact should be ensured between the semiconductor layer 20 and each of the source and drain electrodes 12, 14. For this to be achieved, the work function of the electrodes 12,14 should be matched to the ionization potential of the semiconductor 20. The ionization potential is a measure of the amount of additional energy an electron occupying the Highest Occupied Molecular Orbital (HOMO) in an organic semiconductor material needs to be liberated from the solid semiconductor. Likewise, the work function is a measure of the amount of energy an electron needs to be liberated from a solid metal into free space. In case of an organic thin film transistor the difference between the work function of the metal contacts and the ionization potential of the organic semiconductor relates to the amount of energy a charge carrier needs to be injected from an electrode into the organic semiconductor 20. It will be appreciated that the ability of the electrodes to efficiently accept and donate charge carriers to and from the semiconductor 20 is relevant for forming ohmic contacts.

Secondly, the crystal morphology of the semiconductor 20 needs to be controlled during deposition. Small molecule (SM) organic semiconductors are commonly used as the active semiconductor layer 20 because they crystallize and thus provide high charge carrier mobility within the organic semiconductor film.

Figure 2:
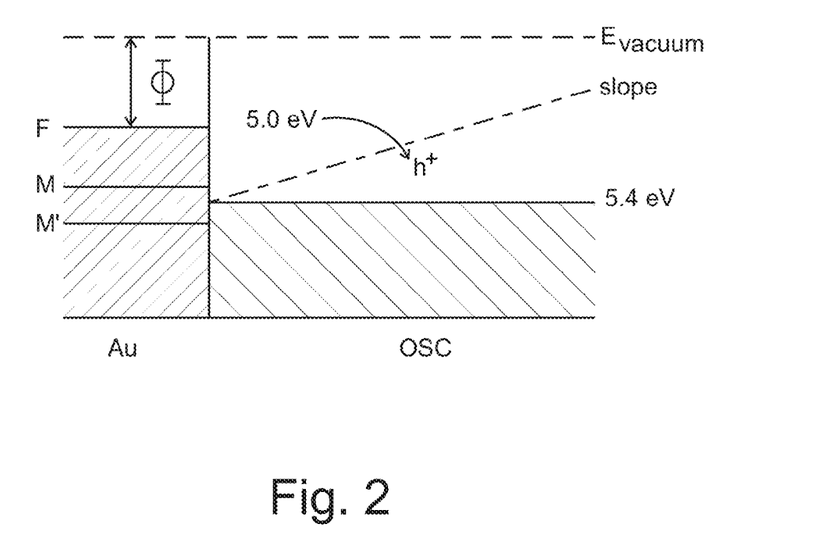
FIG. 2 is a schematic diagram illustrating the work function of an electrode relative to an adjacent semiconductor material, FIG. 3a provides a schematic representation of a perfluoro substituted arene thiol bonding to an electrode, FIG. 3b provides a schematic representation of a fluoroarene thiol bonding to an electrode, FIGS. 4a and 4b each provide a schematic cross-section though an OTFT in the plane of the substrate, schematically illustrating crystal nucleation.

The relevance of the work function is considered in more detail with reference to FIG. 2. This example shows a gold source electrode 12 injecting a hole into an organic semiconductor region 20. The work function ϕ of a solid is the difference between the highest energy level electron in the solid (the Fermi level F) and the energy that electron would have if just liberated from the solid into a vacuum ($E_{vacuum}$). An untreated gold electrode 12 has a work function of about 5.0 eV, but the organic semiconductor 20 typically has a greater ionization potential, e.g. of about 5.4 eV.

That is, the gold 12 contains higher energy electrons than the semiconductor 20. This means there is a potential barrier resisting an electron being transferred from the semiconductor 20 into the gold 12, and hence a barrier resisting a hole being injected from the gold 12 into the semiconductor 20. When a signal is applied at the gate 32, the potential profile within the semiconductor channel region slopes as shown in FIG. 2 and a hole can quantum tunnel across the barrier. Nonetheless, if the work function of the gold electrode 12 can be increased then this barrier will be easier to overcome. Thus a higher work function of the electrodes results in better mobility, and it is desirable to increase the work function of the electrodes to a level close to (M) or even below (M') that of the semiconductor 20.

Various surface treatments exist to modify the work function of the electrodes 12, 14 prior to deposition of the organic semiconductor film 20.

One such treatment is an initial pre-cleaning step of exposing the substrate 20 and electrodes 12, 14 to oxygen plasma.

This pre-cleaning removes contaminants from the surface of the gold and thus increases the work function. However, it also has an unwanted side effect of increasing the presence of ionic species on the surface of the glass substrate 10. These ionic species may lead to the formation of a conducting "back channel" that allows a source-drain current to flow even when the TFT is set to its "off state". This increases the off current, reducing the on/off ratio and the sub-threshold swing and thus worsening performance.

To counter this side-effect, a treatment has been developed comprising the silanisation of the glass surface with organosilanes 16, as disclosed in international patent application publication no. WO 2010/015833. This treatment advantageously reduces the presence of ionic species on the surface of the glass substrate 10.

Self-assembled organo silane monoloayers (SAMs) have also been shown to improve morphologies and electrical transport layers properties in the case of pentacene films evaporated onto $SiO_2$ surfaces ["Morphology and electrical transport in pentacene films on silylated oxide surfaces", K Shankar & T N Jackson, Journal of Materials Research 19, p. 2003 (2004)].

However, the silanisation has a further side effect of somewhat reversing the increase in the work function of the electrodes 12, 14 which was achieved by the pre-cleaning step.

Therefore to increase the work function back to a more desirable level, yet another treatment may be employed. This comprises the application of a treatment substance comprising thiol SAM molecules to the metal source and drain contacts 12, 14. This results in the formation of an electrode contact layer 18 in the form of a self-assembled monolayer (SAM) on the electrodes 12, 14. This treatment is also disclosed in WO 2010/015833.

SUMMARY

Whilst the final treatment 18 above may not damage the glass substrate 10 to too great an extent, and may retain a good work function in the electrodes 12, 14, the inventors have recognized that the resulting electrode contact layer 18 has a yet further drawback. Without thereby being limited by theory, what is believed to happen is that the presence of water and other contaminants results in the nucleation density being similar on the thiol-treated source and drain contacts 12,14 and on the silane-treated OTFT glass substrate 10. The result is that whilst the work function of the electrodes 12,14 is increased by the treatment, the benefit of the high work function will not be fully realized during operation of the finished device due to weak interactions between the electrode surfaces and the organic semiconductor material in the channel region. In order to achieve stronger interactions and therefore gain the full benefit of the high work function, it would be desirable to provide a strong seeding of crystal nucleation points on the surface of the electrodes 12,14. If the contaminants could be removed, then the nucleation density on the thiol-treated source and drain contacts 12,14 would be greatly enhanced relative to the nucleation density on the silane-treated OTFT glass substrate 10.

The inventors have surprisingly found that surface treatment processes for electrodes that involve the formation of electrode contact layers comprising perfluoro arenes or other arene moieties substituted with strongly electron-withdrawing groups enable strong interactions between the semiconductor material and the treated electrode contacts. The inventors believe that this is due to quadrapole interactions occurring between the arene moieties in the electrode contact layer 18 and the arene molecules of the organic semiconductor layer (e.g. perfluoroarene-arene quadrapole interactions). However, these interactions are weakened when water or other contaminants are adsorbed on the electrode contact layer 18, which in turn reduces the crystal nucleation density on the surface of the electrode 12, 14. Furthermore, such a partial deactivation of perfluoroarene-induced nucleation (or such like) may also occur even if the above pre-cleaning and/or silanisation steps are not performed.

According to one aspect of the present invention there is provided a method of producing a semiconductor device, comprising: forming conducting electrodes over a substrate; treating a surface of the electrodes with a treatment substance comprising an arene substituted with an electron-withdrawing group, thereby forming an electrode contact layer over the electrodes; and forming an organic semiconductor layer over the substrate and electrodes; wherein the substrate and electrodes are baked before the organic semiconductor layer is formed, so as to reduce contaminants on the electrode contact layer and thereby promote crystal nucleation on a surface of the electrode.

The present invention thus overcomes at least the above problem by performing a bake step prior to deposition of the semiconductor layer 20, in order to dehydrate the surface and/or remove other contaminants such as residual solvents. This effectively "activates" the treatment molecules 18 on the surface of the electrodes 12, 14, leading to increased nucleation density of the semiconductor on the surface of the electrode and thus increasing the interaction between the electrode surfaces and the organic semiconductor molecules in the channel and so increasing the benefit derived from a high electrode work function.

In embodiments, said treatment substance may comprise an arene moiety in which one or more hydrogen atoms are each substituted with one of a fluorine atom, a trifluoromethyl group, a nitro group and a cyano group.

Said treatment substance may comprise a perfluoro substituted arene moiety. The treatment substance may comprise a pentafluorobenzene moiety. The treatment substance may comprise a trifluoro methyl benzene moiety.

The treatment substance may comprise a thiol group for binding to the surface of the electrodes. The treatment substance may comprise pentafluorobenzenethiol.

The treatment may comprise formation of a self-assembled monolayer.

The bake may be performed at a temperature greater than or equal to 50° C. The bake may be performed at a temperature greater than or equal to 60° C. The bake may be performed at a temperature less than or equal to 140° C. The bake may be performed at a temperature less than or equal to 100° C. The bake may be performed within a temperature range of 60° C. to 70° C.

The bake may be performed substantially at atmospheric pressure.

The bake may be performed in a dry nitrogen atmosphere.

The method may comprise a pre-cleaning step of prior to said treatment. The pre-cleaning step may comprise applying a plasma to the electrodes. The plasma may comprise an oxygen plasma.

The method may comprise a step of applying a reactive species to a channel region between the electrodes prior to said treatment, to react with ionic species in the channel region.

The step of applying said reactive species may be performed after the pre-cleaning step.

The reactive species may comprise a silane. Said silane may comprise an organosilane. Said silane may be for forming a self-assembled monolayer. The silane may comprise phenethyl-trichlorosilane.

The organic semiconductor layer may comprise an acene core semiconductor. The organic semiconductor layer may comprise 6,13-bis(triisopropylsilylethynyl)pentacene.

The substrate may comprise glass. The electrodes may comprise metal. The electrodes may comprise gold, for example at least at said surfaces. The dielectric may comprise a perfluorinated polymer.

The semiconductor device may comprise a thin film transistor. According to another aspect of the present invention, there is provided a semiconductor product comprising a first and second electrode formed on a substrate, and an organic semiconductor layer formed over the electrodes and substrate, the first and second electrode defining a channel region in the organic semiconductor therebetween; wherein: each electrode has an edge in the plane of the substrate bounding the channel region, each electrode having an electrode contact layer formed from a treatment substance applied over said edge; each of said edges is substantially covered with crystal nucleation points of the organic semiconductor; and crystal grains of the organic semiconductor radiate from said nucleation points in a direction substantially normal to each of said edges of the respective electrodes.

This crystal nucleation distribution and orientation of crystal grains is characteristic of a product formed using the above techniques, and provides the described effect of improving the interaction between the electrode surfaces and channel and therefore increasing the benefit derived from a high electrode work function. By "substantially covered" is meant without any parts of the coverage having a negligibly low density of nucleation points relative to the channel region (in terms of the effect on charge-carrier mobility in the adjacent part of the channel). That is, the relative nucleation density along the edge in question has a non-negligible effect on mobility over that entire edge.

In embodiments, the semiconductor product may comprise a grain boundary formed where the crystal grains radiating from the edge of the first electrode meet the crystal grains radiating from the edge of the second electrode.

The grain boundary may be substantially parallel to each of said edges.

The ratio of the number of nucleation points on the surface of electrodes to the number elsewhere over the substrate may be greater than or equal to 6:1.

Such arrangements are further indicative of a product produced using the above techniques.

In further embodiments the substrate may comprise glass. The electrodes may comprise metal. The electrodes may comprise gold at least at said edges.

The semiconductor product may comprise a thin film transistor.

BRIEF DESCRIPTION OF THE DRAWINGS

For a better understanding of the present invention and to show how it may be put into effect, reference is made by way of example to the accompanying drawings in which.

DETAILED DESCRIPTION OF PREFERRED EMBODIMENTS

The preferred embodiments of the present invention provide a method for improving the performance of organic thin film transistor (OTFT) devices comprising soluble small molecule (SM) organic semiconductor (OSC) films cast from solution.

The performance improvements are obtained by using electrode pre-treatments based on self assembled monolayers (SAMs) 18 followed by a substrate dehydration step that ensures both an ohmic contact (between the source/drain electrodes and OSC film) and a "strong" OSC crystallization seeding from the source & drain contacts can be realized. Such a method ensures that both a high mobility and a low variation in mobility is realized in OTFT devices from crystalline OSCs.

In a particularly preferred embodiment the method uses soluble OSC material TIPS Pentacene (6,13-Bis(Triisopropylsilylethynyl)pentacene) in top gate device configuration, gold source and drain electrodes with a pentafluorobenzenethiol pre-treatment, and channel treatment with phenethyl-trichlorosilane.

As discussed, in existing methods electronic properties of the OTFTs such as off current levels and contact resistance are optimized by modifying the surfaces of the channel substrate 10 and/or the surfaces of the source and drain contacts 12,14 by formation of organosilane 16 and thiol SAMs 18 (WO 2010/015833).

As a consequence, an increased nucleation from the source and drain contacts 12,14 is observed with a suppressed nucleation from the glass substrate 10 (channel region), resulting in a high density of OSC crystals forming at the source and drain contacts 12,14. Such a combination of treatments leads to a nucleation of crystallization from the source and drain electrodes 12,14 into the channel region.

However, due to the fact that these pre-treatments are applied in air, traces of water may reside on the surface of the substrates 10 after the application of the SAMs. In addition, the purity level of the source of the thiol SAMs 18 is typically 97-98%, therefore impurities contained within the source of the thiol material may also remain on the surface after the SAM application process (the impurities being non-thiol species which are not adsorbed below electrode surface).

The presence of such impurities on the electrodes will lead to a variation in the strength of nucleation of OSC crystallization from the source and drain electrodes, leading to a variation in the device performance, in particular the field effect mobility.

In this disclosure, by incorporating a "dehydration" bake after the application of the SAM pre-treatments 16, 18 (either in a glove box, or still applied in air) but before applying the OSC layer 20, the fluorinated benzene moieties on the electrode surface are exposed thus allowing for a strong interaction between the OSC material 20 and the fluorinated benzene moieties 18 on the electrode surface. Such a pre-treatment ensures a more uniform device performance is obtained.

As is observed in silicon based transistor devices (poly crystalline Si as an example), crystalline OSC materials allow for higher field effect mobilities, but can often result in larger mobility variations (both absolute and fractional) than amorphous materials. This trend is observed due to the fact that crystal orientation and size can vary within the channel region, depending on the density of nucleation centres for crystalline growth. Here, the nucleation density of the semiconductor material 20 is controlled from the source and drain electrode region 12, 14.

Such a spread in performance is seen as a barrier to device implementation in applications, as circuit performance will vary dramatically across the device substrate. In addition, circuit simulation and design will be problematic, as channel scaling (channel width) may not be realized.

This disclosure shows that the dehydration step after SAM application 18 can reduce the device performance variation (mobility) and is an important step to help realize the possibility for high mobility crystalline materials to be used in OTFT device applications.

Particularly significantly, embodiments of this invention have been observed to work in the case of an acene core semiconductor material, TIPS Pentacene, where the strongest nucleation is observed to be beneficial to field effect mobility.

The device structure & SAM materials used in this disclosure are described in detail in WO 2010/015833, and the same may be used for the basis for preferred implementations of this invention.

Referring to FIG. 1, essentially a top-gate, bottom-contact device is fabricated according to the following steps.

Definition of source and drain electrodes 12, 14 on glass substrate 10 (usually by photolithography), typically 5 nm Cr followed by 40 nm Au.

Exposure of the substrate 10 to oxygen plasma (for pre-cleaning).

Application of phenethyl-trichlorosilane SAM 16 from solution and rinsing in host solvent.

Application of pentafluorobenzenethiol SAM solution 18 and rinsing in host solvent.

dehydration bake of substrate on hotplate (can be made in either air or a glovebox environment, as can the following steps below).

Application of TIPS Pentacene film 20 (e.g. from tetralin) and dry film.

Application of dielectric layer 30 and dry film.

Application of gate electrode 32.

Such a process flow provides for a low crystallization density in the channel region and high density on the source & drain electrode regions of the device.

In a preferred embodiment step (i) comprises the forming of metal source and drain electrodes 12, 14 over a glass substrate 10, e.g. formed of 5 nm of chromium followed by 40 nm of gold, thus presenting a substantially gold surface to the channel region. The forming of the electrodes 12, 14 may be performed by any suitable technique such as photolithography. The source and drain electrodes define a channel region therebetween. The channel length may be of the order of 500 μm, 200 μm, 100 μm or preferably 20 μm or less (the contribution of contact resistance to the overall resistance becomes relatively more important with shorter channel lengths).

Step (ii) preferably comprises exposure of the substrate 10 to oxygen plasma for the purpose of pre-cleaning. As mentioned, such pre-cleaning removes contaminants from the surface of the gold and thus increases the work function, but can also have an unwanted side effect of increasing the presence of ionic species on the surface of the substrate 10. E.g. such species could include carboxylic acid groups and —OH surface groups. These ionic species may lead to the formation of a conducting "back channel" that allows a source-drain current to flow when the TFT is set to its "off state". This increases the off current, reducing the on/off ratio and the sub-threshold swing and thus worsening performance.

At step (iii) the channel region is treated by applying a reactive species 16 which reacts with ionic species as described in WO 2010/015833. In the described example this comprises applying a silane to the substrate 10, preferably an organosilane, and most preferably a self-assembled organosilane such as phenethyl-trichlorosilane. As discussed, the silanisation treatment advantageously reduces the presence of ionic species on the surface of the glass substrate 10, but also causes a further side effect of somewhat reversing the increase in the work function of the electrodes 12, 14 which was achieved by the pre-cleaning step.

Accordingly, at step (iv) a treatment substance may be deployed, such as a fluorine-substituted arene thiol, in order to form an electrode contact layer 18 and thereby increase the work function of the source and drain electrodes 12, 14, as also described in WO 2010/015833. Preferably the treatment comprises a perfluoro substituted arene thiol or oligo-fluoroarene thiol, and most preferably a pentafluorobenzene thiol or a trifluoromethyl difluorobenzene thiol as illustrated schematically in FIGS. 3a and 3b respectively. However, in other embodiments one or more fluorines in the arene ring could be replaced by other halogens, nitro, or cyano groups. Preferably the treatment substance comprises a thiol for binding to the surface of the electrodes. This bonds particularly well to metal electrodes 12, 14 and especially so in the case of gold. Thus the most preferred treatment substance found is pentafluorobenzenethiol (PFB thiol). However, an alternative to thiol could be used such as a disulphide.

As discussed, whilst the treatment substance 18 may not damage the glass substrate 10 to too great an extent and may retain a good work function in the electrodes 12, 14, it also has a yet further drawback of attracting water molecules and other contaminants. This is believed to be due to polar groups in the treatment substance 18 interacting with the dipole moment of water, residual solvent or other contaminants. This in turn affects the crystal morphology of the semiconductor 20 when formed, in that fewer crystal nucleation points form on the surface of the electrodes 12,14 relative to the number forming elsewhere over the substrate 10. The result is that whilst the work function of the electrodes 12,14 is increased by the treatment, the benefit of the high work function will not be fully realized during operation of the finished device due to a reduced interaction between the electrode surfaces and the channel region.

To address this problem, a dehydration bake is performed at step (v) according to embodiments of the present invention. Preferably the electrodes 12,14 are left substantially free of contaminants, though even a reduction is beneficial. When the semiconductor material 20 is subsequently formed over the substrate 10 and the source and drain electrodes 12,14, at step (vi), then the preceding bake will have advantageously ensured a strong seeding of crystal nucleation points on the surface of the electrodes 12,14, thereby achieving a strong interaction between the channel and the electrode surfaces and so enabling the full benefit of the high work function of the gold to be realized.

The semiconductor 20 is preferably an organic semiconductor such as TIPS Pentacene (6,13-Bis(Triisopropylsilylethynyl)pentacene) The organic semiconductor solution may be applied by any suitable technique such as spin coating.

Figure 4A:
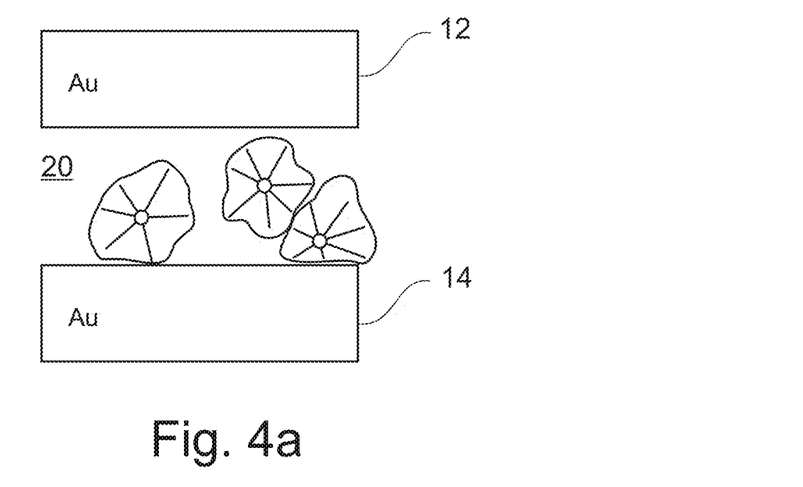

FIG. 4a is a schematic representation of typical crystal morphology without the bake step (v). As shown, the crystal nucleation points (represented by dots) can tend to form anywhere in the channel region between the source and drain electrodes 12, 14 and not necessarily on their surface. Further, the crystal grains radiate from the nucleation points in any direction within the channel region.

Figure 4B:
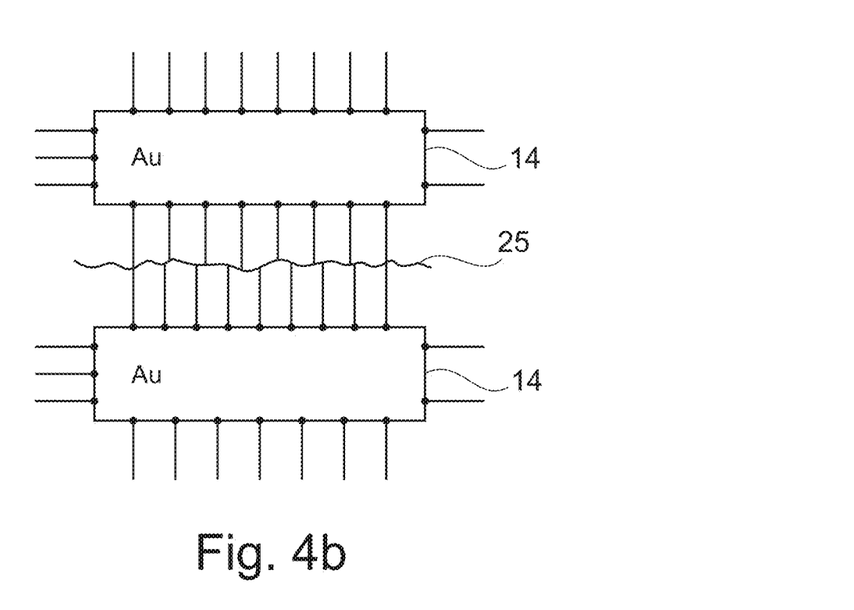

FIG. 4b is a schematic representation of an improved morphology according to one aspect of the present invention. Here it can be seen that the nucleation points substantially cover the source and drain electrode edges bounding the channel region, or indeed the entire perimeter, in the plane of the substrate 10. Further, substantially all of the crystal grains have a highly ordered orientation, radiating substantially at right angles (normal) to the edges of the electrodes 12, 14. This morphology advantageously provides the desired strength of interaction between the channel and the electrode surfaces. Some prior techniques may have achieved full coverage without a bake step, but it is believed that none has previously achieved this with the highly aligned radial grain orientation achieved according to this aspect of the present invention.

Figure 7A:
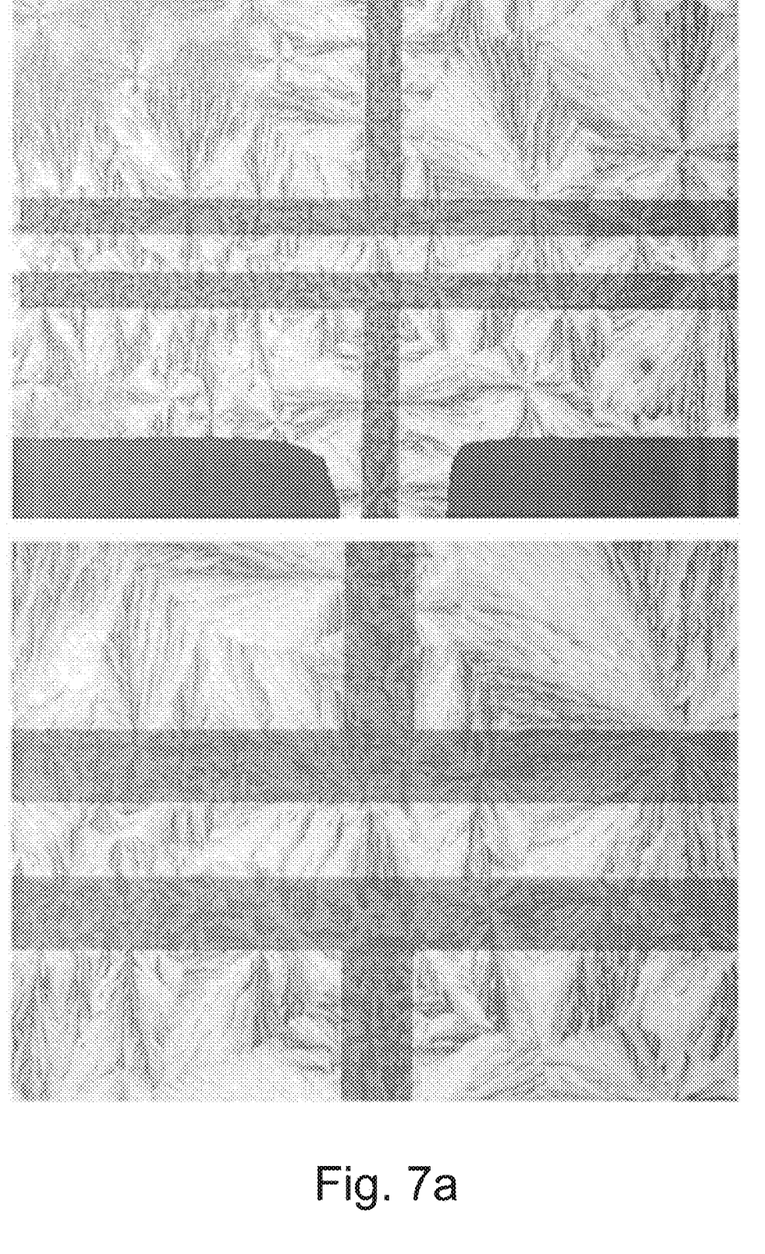
Figure 7B:
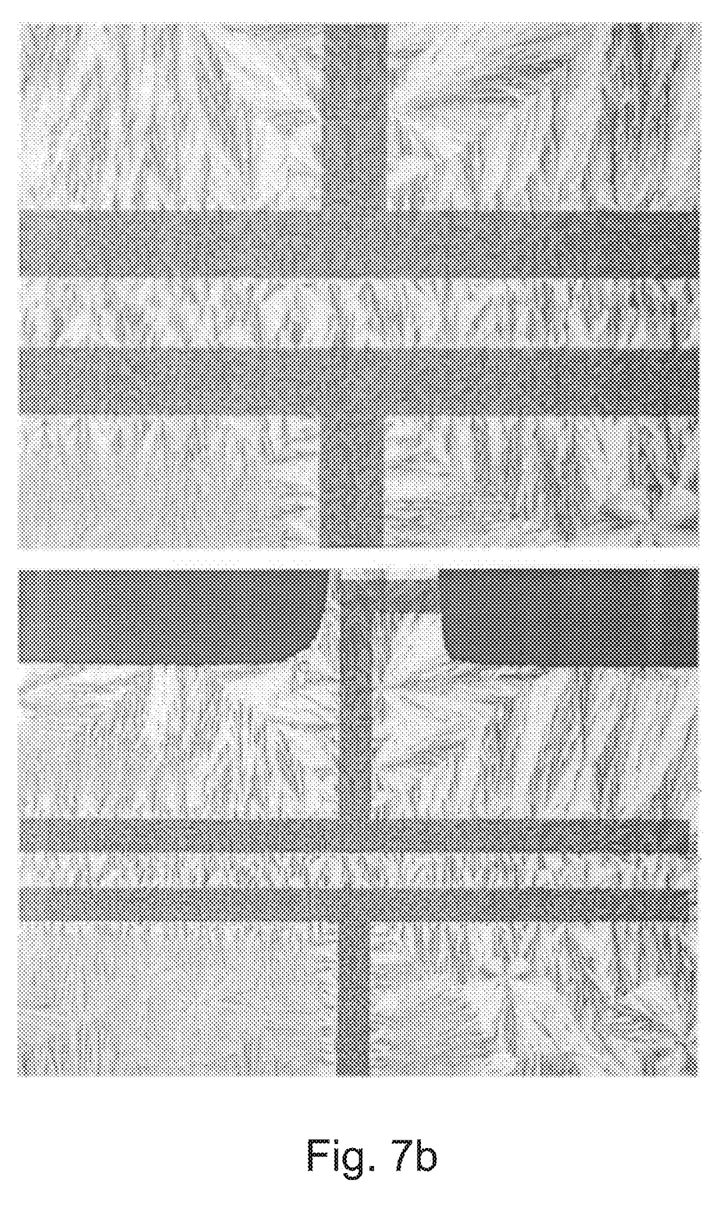

FIG. 7a shows an image taken of the crystal morphology in an actual OTFT formed without a dehydration bake step, and FIG. 7b shows an image taken of the morphology in a corresponding OTFT formed with a bake step. As can be seen, in FIG. 7b there is strong nucleation from the source and drain contacts.

FIG. 7b shows substantive formation of a line of grain boundaries in the middle of the transistor channel, and the crystals in the channel region are much smaller than those outside of the channel region. In FIG. 7a on the other hand there is weak nucleation from the source and drain contacts. FIG. 7a shows no formation of a line of grain boundaries in the middle of the transistor channel, and the crystals in the channel region are the same size as the crystals outside of the channel region.

The present invention suppresses the nucleation over the glass substrate 10 whilst increasing nucleation on the metal surfaces 12, 14. An achievable ratio of the number of nucleation points (nucleation density) on the surface of the electrodes 12, 14 to the number elsewhere using the techniques according to the present invention is 6:1 or better. Again this is beneficial for a strong interaction.

In embodiments, one particularly indicative feature that the device has been formed according to the present invention is the presence of a grain boundary 25 formed in the semiconductor material 20 where the grains radiating in an oriented manner from one electrode 12 meet the grains radiating in an oriented manner from the opposing electrode 14.

These effects have been found to be particularly prominent in the case of gold source and drain electrodes 12, 14 over a glass substrate 10 and with an organic semiconductor layer 20. However, the effect may also be achieved to a lesser extent in other configurations.

Figure 5:
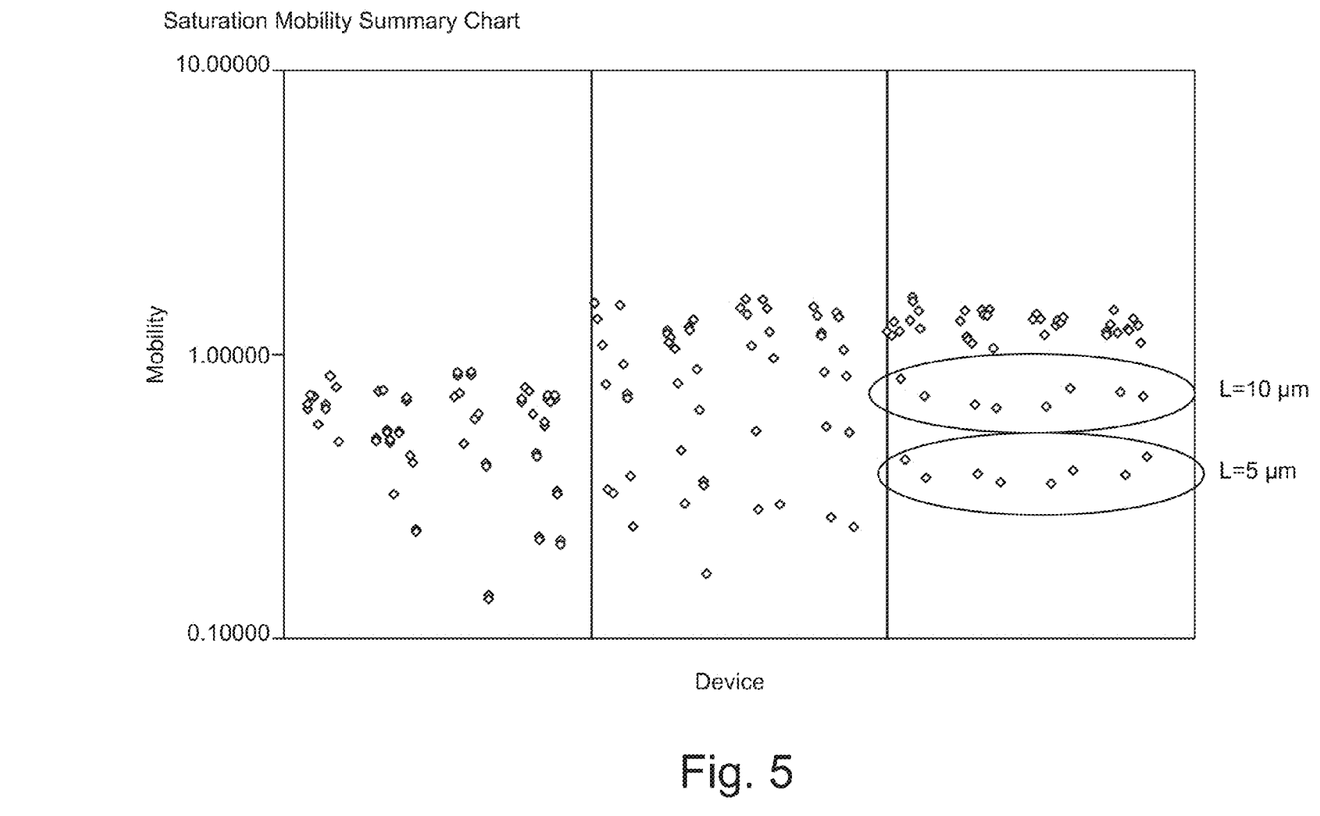
FIG. 5 is a plot showing the measured mobility of a plurality of samples of devices.

By way of example, FIG. 5 shows a plot of devices which have been fabricated using two different dehydration bake conditions: 100° C. for 2 minutes, and 60° C. for 10 minutes; along with a reference device without the dehydration bake process. This example used TIPs pentacene in top gate device configuration, gold source and drain electrodes with a pentafluorobenzenethiol pre-treatment, and a channel treatment with phenethyl-trichlorosilane. Below are the saturation mobility results.

Column 1=No dehydration bake (reference)
Column 2=With dehydration bake 100° C. 2 mins
Column 3=With dehydration bake 60° C. 10 mins A clear improvement in both the mobility values and spread can be seen in column 3 over the reference devices in column 1.

The temperature of the bake should preferably be kept within a certain range. If the temperature is taken too high then the SAMs 16 and/or 18 may be disturbed. In embodiments such as that described in steps (i) to (v) this will start to be a problem at about 140° C., and the temperature is preferably kept to 100° C. or less. Much over 140° C. will destroy most of the increase in work function achieved by step (iv). On the other hand if the temperature is not taken high enough the bake may be ineffective. In embodiments such as that described in steps (i) to (v) this will be a problem if the temperature does not rise beyond 50° C., and some efficacy may be lost below 60° C. The preferred range for the example of steps (i) to (v) is 60° C. to 70° C. A bake at the lower end of this range for a relatively longer amount of time is particularly preferred.

The bake is preferably performed at substantially atmospheric pressure and in a dry nitrogen atmosphere. However, other conditions are possible such as in a vacuum, at sub-atmospheric pressures, and/or in other dry atmospheres, with roughly the same temperature ranges being used.

Furthermore, note that steps (ii) and (iii) are not preconditions for obtaining the benefit of the bake step (v).

Figure 6:
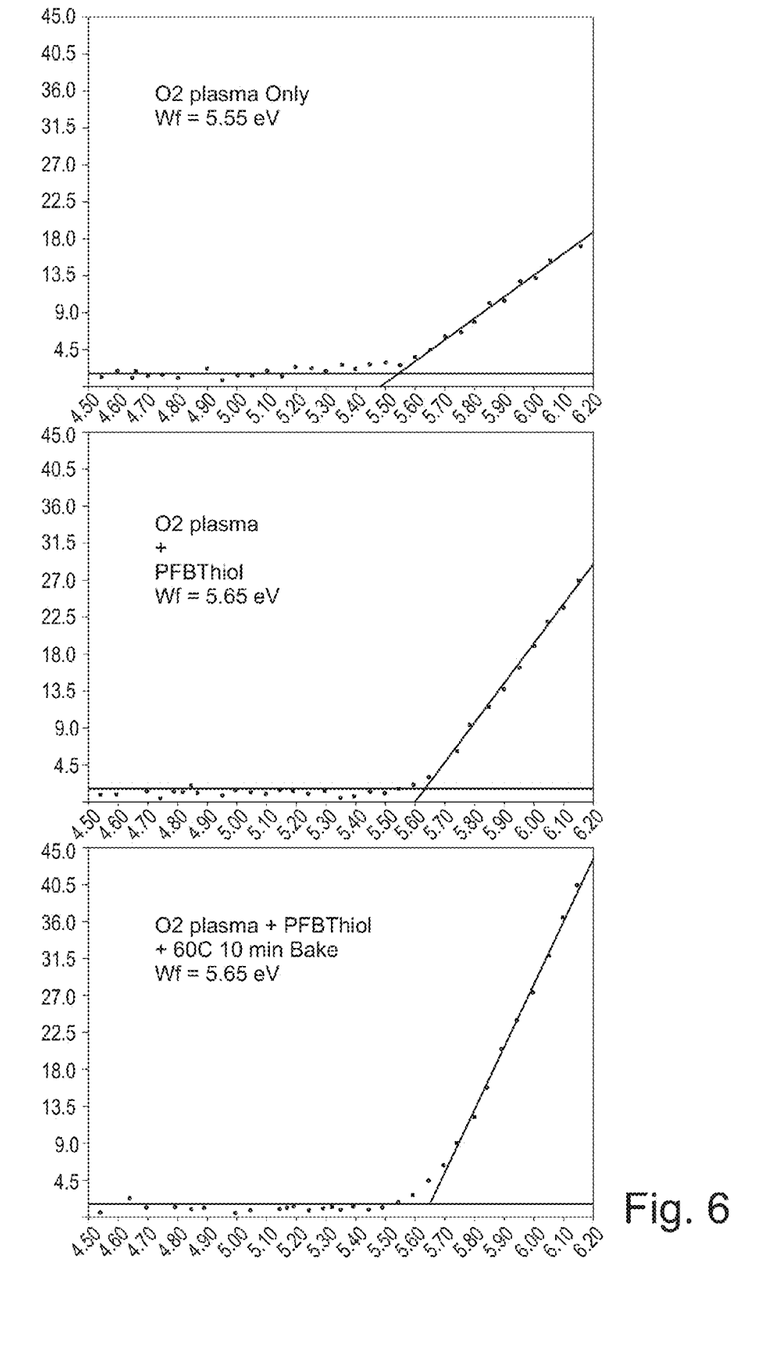
FIG. 6 shows results of a photoelectron yield spectroscopy analysis, and FIGS. 7a and 7b provide images of nucleation in an OTFT.

As shown in FIG. 6, photoelectron yield spectroscopy analysis has also been made on substrates with the pentafluorobenzenethiol treated contacts 12, 14 that have undergone the substrate dehydration step (v). An improvement in the photoelectron yield is observed after the dehydration step has been incorporated (second to third plot), which confirms that contaminants are removed from the surface of pentafluorobenzenethiol treated contacts upon baking.

At step (vii) the dielectrics layer 30 is formed over the semiconductor layer 20. the dielectric is preferably a perfluorinated polymer but could be any other suitable dielectric. At step (viii) the conducting gate electrode 32 is formed over the dielectric layer 30.

It will be appreciated that the above embodiments have been described only by way of example.

Figure 3A:
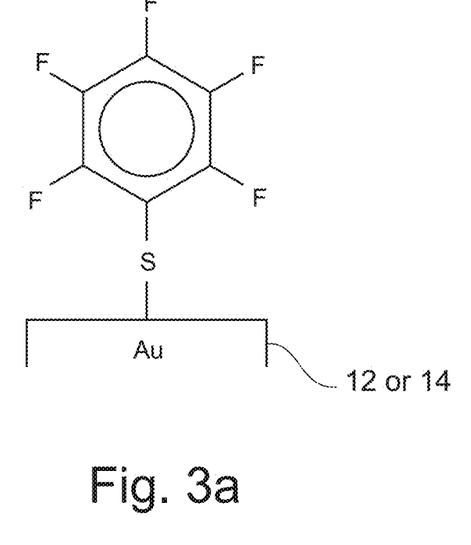
Figure 3B:
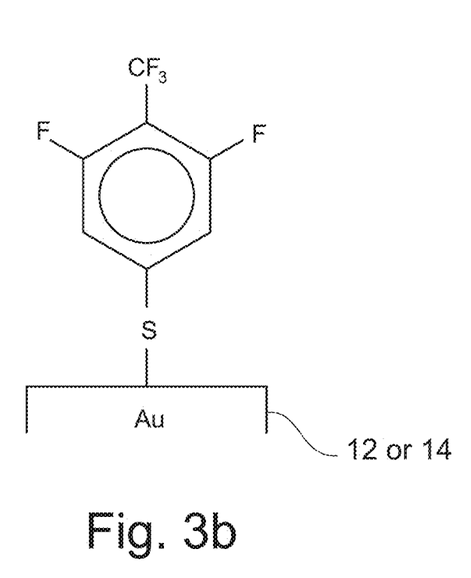

For instance, although preferred, it is not necessary for all the hydrogen of the arene moiety used as the treatment substance to be replaced by fluorines as in FIG. 3a. The invention can also be performed in a case such as FIG. 3b where fewer hydrogens are replaced by fluorines. Also, other strongly electron-withdrawing groups such as nitro- or cyano-groups, either alone or in combination with fluorine substituents, could be used to induce strong quadrupole interactions. So more generally the invention can be implemented using any arene moieties in which at least one, preferably several, and most preferably all hydrogen atoms are substituted with fluorine atoms, trifluoromethyl groups, nitro groups, cyano groups, or other strongly electron-withdrawing substituents.

For instance, in other embodiments other types of substrate 10 could be used in step (i), such as plastic, a non-active silicon layer, poly(ethylene-terephthalate) (PET), poly(ethylene-naphthalate) (PEN), polycarbonate or polyimide. Further, the gate electrodes can be selected from variety of alternative materials such as metals (e.g. gold, aluminum, silver, copper or alloys thereof); metal oxide ceramic compounds (e.g. indium tin oxide); or conductive polymers. The forming of the electrodes 12,14 may be performed by any suitable technique such as photolithography, shadow mask evaporation, or ink jet printing in the case of a conductive polymer solution.

With regard to step (ii), other pre-cleaning steps could alternatively be employed, such as exposure to other types of plasma or a UV ozone pre-cleaning step. In step (iii), other reactive species may be used such as hexamethyldisilazane (HMDS). At step (iv) the semiconductor may be applied by any suitable technique such as spin coating, ink jet printing, spray coating, LITI or flexographic coating. At step (viii), any of the materials described in relation to the source and drain electrodes may also be suitable for the gate electrode 32.

Note also that the term "bake" in its most general sense used herein is not intended to limit the manner of heating. E.g. the baking can be performed on a hot plate in air, or on a hot plate in a nitrogen filled glove box. Alternatively, the bake step could also be performed in a vacuum oven (i.e. in an enclosed container). Most generally, any heating step could be used and the term bake as used herein therefore may refer to any heating step.

Other variants of the technique may be apparent to a person skilled in the art given the disclosure herein. The invention is not limited by the described embodiments but only by the appendant claims.

The invention claimed is:

1. A method of producing a semiconductor device, the method comprising:
   forming conducting electrodes over a substrate wherein the electrodes comprise metal;
   treating a surface of the electrodes with a treatment substance comprising an arene substituted with an electron-withdrawing group and a thiol group, the thiol group binding to the surface of the electrodes, thereby forming an electrode contact layer over the electrodes; and
   forming an organic semiconductor layer over the substrate and electrodes;
   wherein the substrate and electrodes are baked before the organic semiconductor layer is formed, so as to dehydrate the surface of the electrode contact layer and thereby promote crystal nucleation of the organic semiconductor on a surface of the electrode;
   wherein the bake is performed at a temperature greater than or equal to 60° C. and less than or equal to 140° C.

2. The method of claim 1, wherein said treatment substance comprises an arene moiety in which one or more hydrogen atoms are each independently substituted with one of a fluorine atom, a trifluoromethyl group, a nitro group and a cyano group.

3. The method of claim 1, wherein said treatment substance comprises a perfluoro substituted arene moiety.

4. The method of claim 3, wherein the treatment substance comprises a pentafluorobenzene moiety.

5. The method of claim 4, wherein the treatment substance comprises pentafluorobenzenethiol.

6. The method of claim 1, wherein the treatment substance comprises a trifluoro methyl benzene moiety.

7. The method of claim 1, wherein the treatment comprises formation of a self-assembled monolayer.

8. The method of claim 1, wherein the bake step is performed within a temperature range of about 60° C. to about 70° C.

9. The method of claim 1, further comprising a pre-cleaning step prior to said treating step.

10. The method of claim 9, wherein the pre-cleaning step comprises applying a plasma to the electrodes.

11. The method of claim 9, further comprising a step of applying a reactive species to a channel region between the electrodes prior to said treatment, to react with ionic species in the channel region, wherein the step of applying said reactive species is performed after the pre-cleaning step.

12. The method of claim 1, further comprising a step of applying a reactive species to a channel region between the electrodes prior to said treatment, to react with ionic species in the channel region.

13. The method of claim 12, wherein the reactive species comprises a silane.

14. The method of claim 13, wherein the silane comprises phenethyl-trichlorosilane.

15. The method of claim 1, wherein the semiconductor layer comprises an acene core semiconductor.

16. The method of claim 1, wherein the semiconductor layer comprises bis(triisopropylsilylethynyl)pentacene.

17. The method of any preceding claim 1, wherein said substrate comprises glass.

18. The method of claim 1, wherein the electrodes comprise gold at least at said surfaces.

19. The method of claim 1, further comprising the step of forming a dielectric layer over said organic semiconductor layer wherein the dielectric layer comprises a perfluorinated polymer.

* * * * *